United States Patent [19]

Matsui et al.

[11] Patent Number: 4,853,936
[45] Date of Patent: Aug. 1, 1989

[54] INDEX GUIDED SEMICONDUCTOR LASER DEVICE

[75] Inventors: Sadayoshi Matsui, Tenri; Shinji Kaneiwa; Taiji Morimoto, both of Nara; Masahiro Yamaguchi, Tenri; Mototaka Taneya, Tsukuba; Mitsuhiro Matsumoto, Nara, all of Japan

[73] Assignee: 501 Sharp Kabushiki Kaisha, Osaka, Japan

[21] Appl. No.: 181,016

[22] Filed: Apr. 13, 1988

[30] Foreign Application Priority Data

Apr. 15, 1987 [JP] Japan .................................. 62-94081

[51] Int. Cl.$^4$ ............................................. H01S 3/19
[52] U.S. Cl. ......................................... 372/45; 372/48
[58] Field of Search ..................... 372/45, 46, 48, 96, 372/19, 29, 32

[56] References Cited

U.S. PATENT DOCUMENTS

| 4,251,780 | 2/1981 | Seifres et al. | 372/46 |
| 4,257,011 | 3/1981 | Nakamura et al. | 372/46 |
| 4,592,062 | 5/1986 | Yamamoto et al. | 372/48 |

FOREIGN PATENT DOCUMENTS

| 10006723 | 1/1980 | European Pat. Off. . |
| 10057919 | 8/1982 | European Pat. Off. . |
| 10162569 | 11/1985 | European Pat. Off. . |
| 11513892 | 6/1978 | United Kingdom . |
| 11588019 | 4/1981 | United Kingdom . |

Primary Examiner—James W. Davie
Attorney, Agent, or Firm—Irell & Manella

[57] ABSTRACT

An index guided semiconductor laser device comprising a striped optical waveguide in the active layer, at least a part of the wavegide having continuous indentations at the interface between the waveguide and the outside of the waveguide, whereby only laser light of a high-order transverse mode is radiated from the waveguide to the outside of the waveguide and only laser light of the fundamental transverse mode is propagated within the waveguide.

8 Claims, 2 Drawing Sheets

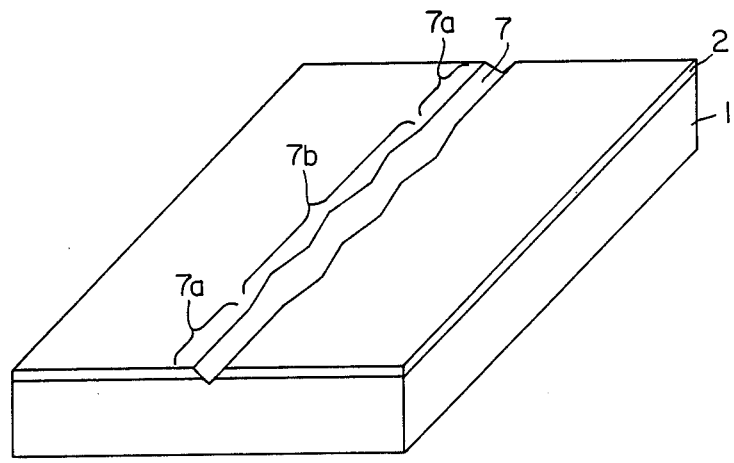
FIG. IA
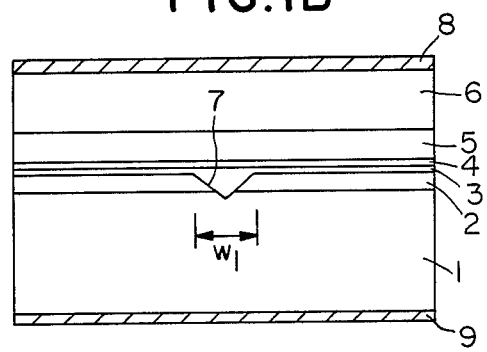
FIG. IB

PROPAGATION OF LASER LIGHT

FUNDAMENTAL MODE

FIRST ORDER MODE

SECOND ORDER MODE

DISTRIBUTION OF ELECTRIC FIELD

INDEX GUIDED SEMICONDUCTOR LASER DEVICE

BACKGROUND OF THE INVENTION

1. Field of the Invention:

This invention relates to an index guided semiconductor laser device that attains laser oscillation in the fundamental transverse mode up to high output power.

2. Description of the prior art:

In recent years, the demand for semiconductor laser devices with high output power has been on the increase in the field of optical disk files, laser printers, and the like. To meet this need, a variety of structures for semiconductor laser devices have been proposed, in which, for example, the thickness of the active layer is as thin as about 0.04 μm in the vicinity of the facets or over the entire area of the resonator, so that the distribution of the optical intensity in the direction vertical to the plane of the p-n junction can be enlarged, increasing the light-emitting area, thereby decreasing the optical output density and decreasing crystal destruction by light absorbance of the facets.

On the other hand, in order to increase the light-emitting area in the direction parallel to the plane of the p-n junction, in the case where the width of the current injection region or the width of the optical waveguide is set to be as wide as 5 μm or more, when the current injected as increased so as to obtain optical output, laser oscillation arises in a high-order transverse mode or the distribution of the optical intensity of the fundamental transverse mode is changed. Laser light produced in this situation cannot be used in an optical disk system for recording information on optical disks or replaying the information by the use of focused beams at the diffraction limit, which are obtained from an optical lens, or for a laser printer for forming latent images with high-density control of focused beams.

SUMMARY OF THE INVENTION

The semiconductor laser device of this invention, which overcomes the above-discussed and other numerous disadvantages and deficiencies of the prior art, comprises a striped optical waveguide in the active layer, at least a part of the waveguide having continuous indentations at the interface between the waveguide and the outside of the waveguide, whereby only laser light of a high-order transverse mode is radiated from said waveguide to the outside of the waveguide and only laser light of the fundamental transverse mode is propagated within said waveguide.

The inclination of the indentations of said waveguide is at a fixed value such that only laser light of the fundamental oscillation mode attains a total internal reflection on the indented wall of said waveguide and laser light of a high-order mode permeates from the indented wall of said waveguide.

In a preferred embodiment, the waveguide has indentations which are formed so that the indentation faces are made up of straight planes or lines, which form distinct angles at the points where these lines or surfaces meet, said indentations being dispersed on both sides of the waveguide in such a way that the sides of the waveguide are at all times mirror images of each other.

In a preferred embodiment, the waveguide has indentations which are formed so that the indentation faces are made up of straight planes or lines which form distinct angles at the points where these lines or surfaces meet, said indentations being dispersed on only one side of the waveguide.

In a preferred embodiment, the waveguide has indentations which are formed so that the indentation faces are made up of straight planes or lines which form distinct angles at the points where these lines or surfaces meet, said indentations being dispersed on both sides of the waveguide in such a way that the sides of the waveguide are at all times parallel.

In a preferred embodiment, the waveguide has indentations which are formed so that the indentation faces are made up of curved planes or lines which do not form distinct angles at the points where these lines or surfaces meet, said indentations being dispersed on both sides of the waveguide in such a way that the sides of the waveguide are at all times parallel.

In a preferred embodiment, the waveguide has indentations which are formed so that the indentation faces are made up of curved planes or lines which do not form distinct angles at the points where these lines or surfaces meet, said indentations being dispersed on both sides of the waveguide in such a way that the sides of the waveguide are at all times mirror images of each other.

In a preferred embodiment, the waveguide has indentations which are formed so that the indentation faces are made up of curved planes or lines which do not form distinct angles at the points where these lines or surfaces meet, said indentations being dispersed on only one side of the waveguide.

Thus, the invention described herein makes possible the objectives or providing a semiconductor laser device with high output power that attains layer oscillation in a stabilized fundamental transverse mode in the direction parallel to the plane of the p-n junction even at times of high-output power operation.

BRIEF DESCRIPTION OF THE DRAWINGS

This invention may be better understood and its numerous objects and advantages will become apparent to those skilled in the art by reference to the accompanying drawings as follows:

FIG. 1A is a perspective view showing the main portion of a semiconductor laser device of this invention.

FIG. 1B is a front sectional view showing the semiconductor laser device of this invention shown in FIG. 1A.

DESCRIPTION OF THE PREFERRED EMBODIMENTS

Figure 2A:
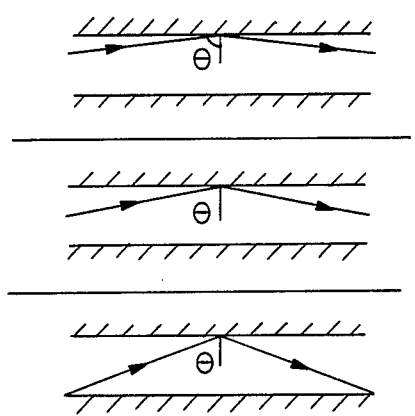
FIG. 2A is a schematic diagram, showing the propagation of laser light of each of the fundamental oscillation mode, the first oscillation mode and the second oscillation mode within the waveguide.

Laser light undergoes a total internal reflection at the interface between the waveguide and the outside of the waveguide while being propagated within the waveguide. In general, the angle of the total internal reflection of laser light of a high-order transverse mode is smaller than that of laser light of the fundamental oscillation mode.

This invention provides a semiconductor laser device in which the inclination of indentations of the above-mentioned interface is at a fixed value, so that only laser light of the fundamental oscillation mode attains a total internal reflection on the indented wall of the waveguide and laser light of a high-order mode is radiated from the interface to the outside of the waveguide. Therefore, laser light of a transverse mode in the direction parallel to the active layer can oscillate in a stabilized fundamental transverse mode.

EXAMPLES

FIGS. 1A and 1B show a VSIS semiconductor laser device of this invention, which is manufactured as follows: On a p-GaAs substrate 1, an n-GaAs current blocking layer 2, a p-GaAlAs cladding layer 3, a p- or n-GaAlAs (or GaAs) active layer 4, an n-GaAlAs cladding layer 5 and an n-GaAs cap layer 6 are successively grown by liquid phase epitaxy.

After the current blocking layer 2 with a thickness of about 1 μm is grown on the p-GaAs substrate 1, as shown in FIG. 1A, a striped channel 7 with a depth of about 1.3 μm is formed from one facet to the other in a manner to reach the substrate 1 through the current blocking layer 2 by an etching technique. The portion 7a of the channel 7 in the vicinity of both facets are straight and have a fixed width $W_1$ and the other portion 7b of the channel 7 in the center of the resonator has indentations on both sides thereof. The indentations on one side of the channel portion 7b are mirror images of the opposite side 7b. The width $W_1$ of the channel portion 7a is set at 5 μm or more so that the optical output density at the facets can be decreased.

Then, electrodes 8 and 9, respectively, are formed on the upper face of the cap layer 6 and the back face of the substrate 1, resulting in an index guided semiconductor laser device of this invention.

Due to the p-n reverse junction, a current path is formed in the region of the channel 7 in the current blocking layer 2, and current is injected into a striped region of the active layer 4 that corresponds to the striped channel 7.

The semiconductor laser device obtained above operates as follows:

When the distance between the active layer 4 and the current blocking layer 2 is set to be, for example, about 0.1-0.5 μm (that is, a distance that laser light generating in the active layer 4 can reach the said current blocking layer 2), the laser light that has permeated from the active layer 4 into the current blocking layer 2 is absorbed by the current blocking layer 2, so that there can be a difference between the effective refractive index of the region of the active layer 4 positioned over the current blocking layer 2 and the effective refractive index of the region of the active layer 4 positioned over the channel 7 in which the light absorbance does not arise because the current blocking layer does not exist. This means that a difference Δn in the built-in refractive index is created in the active layer 4 in the transverse direction. As a result, the light-confining effect with regard to laser light of a transverse oscillating mode arises in the portion of the active layer 4 positioned above the channel 7, resulting in an index waveguide by which the oscillation region of the active layer 4 is defined to be of a striped form. Laser oscillation in a high-order mode is suppressed in the waveguide of this semiconductor laser device.

Figure 2B:
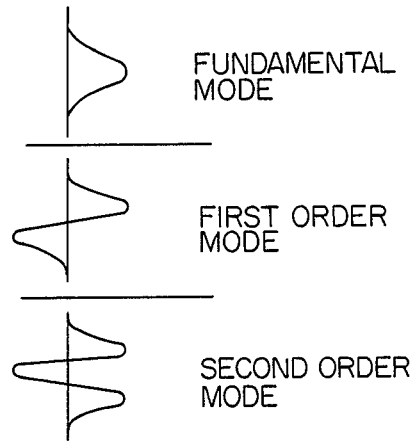
FIG. 2B is a schematic diagram showing the electric field distribution of laser light of each mode corresponding to the oscillation mode of FIG. 2A.

The reason why laser oscillation in a high-order mode is suppressed in the waveguide of the above-mentioned semiconductor laser device is as follows: FIG. 2A shows the total internal reflection that arises at the time when laser light of each of the fundamental oscillation mode, the first oscillation mode and the second oscillation mode is incident upon the interface between the waveguide and the outside of the said waveguide, wherein $\theta$ is the angle of the total internal reflection. It can be seen from FIGS. 2A and 2B that the angle $\theta$ of the total internal reflection decreases with an increase in the order of oscillation mode.

As mentioned above, the angle of a total internal reflection of laser light in a high-oscillation mode is smaller than that of laser light in the fundamental oscillation mode, and accordingly when the inclination of each of the indentations of the interface between the waveguide and the outside of the waveguide is set at a fixed value, laser light of the fundamental oscillation mode necessarily achieves a total internal reflection whereas laser light of a high-order oscillation mode is necessarily radiated from the interface between the waveguide with indentations and the outside of the waveguide to the outside of the waveguide so that the laser light of a high-order oscillation mode cannot be propagated within the waveguide, thereby attaining the suppression of laser oscillation in a high-order mode.

It was observed from experiments by the inventors of this patent application that the above-mentioned semiconductor laser device of this example having the striped channel 7 with indentations oscillated laser light in the fundamental mode up to an output power of as high as about 200 mW whereas conventional semiconductor laser devices having a striped channel without indentations oscillated laser light in a high-order mode at an output power of as low as about 50 mW. The far-field pattern of laser light attained by the semiconductor laser device of this example exhibited a single peak having a lobe full-width of the half maximum of about 7° in the direction parallel to the active layer and having a lobe full-width of the half maximum of about 15° in the direction vertical to the active layer. The elliptic index of this far-field pattern was, thus, about 2. In this way, an isotropic laser light that is useful as a light source in optical disk systems or the like can be obtained.

Figures 3, 4, 5, 6, 7:
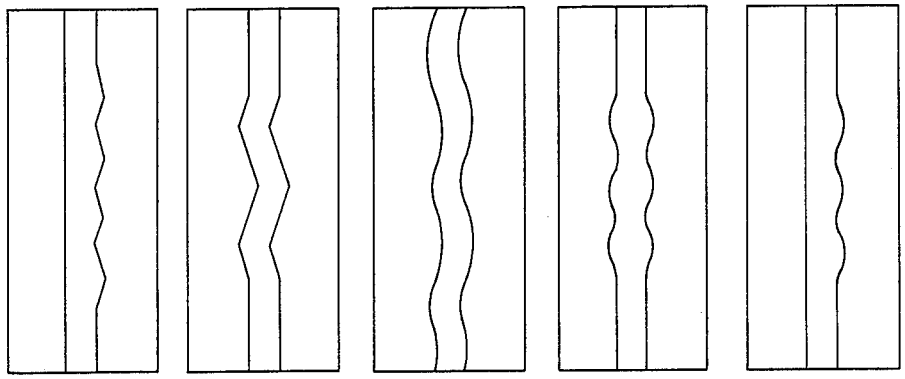
FIGS. 3 to 7, respectively, are plane views showing other semiconductor laser device configurations of this invention.

FIGS. 3 to 7 show other semiconductor laser devices of this invention, wherein the waveguide of FIG. 3 has indentations which are formed so that the indentation faces are made up of straight planes or lines which form distinct angles at the points where these lines or surfaces meet, said indentations being dispersed on only one side of the waveguide, the waveguide of FIG. 4 has indentations which are formed so that the indentation faces are made up of straight planes or lines which form distinct angles at the points where these lines or surfaces meet, said indentations being dispersed on both sides of the waveguide in such a way that the sides of the waveguide are at all times parallel, the waveguide of FIG. 5 has indentations which are formed so that the indentation faces are made up of curved planes or lines which do not form distinct angles at the points where these lines or surfaces meet, said indentations being dispersed on both sides of the waveguide in such a way that the sides of the waveguide are at all times parallel, the waveguide of FIG. 6 has indentations which are formed so that the indentations faces are made up of curved planes or lines which do not form distinct angles at the points where these lines or surfaces meet, said indentations being dispersed on both sides of waveguide in such a way that the sides of the waveguide are at all times mirror images of each other, the waveguide of FIG. 7 has indentations which are formed so that the indentation faces are made up of curved planes or lines which do not form distinct angles at the points where these lines or surfaces meet, said indentations being dispersed on only one side of the waveguide.

Although the above-mentioned examples disclose only a p-GaAs semiconductor compound as a substrate on which a crystal is grown, this invention is, of course, applicable to an n-GaAs semiconductor compound as the substrate. In this case, the conductivity type of each grown layer is opposite to that of the grown layer of the semiconductor laser device of the above-mentioned examples.

Moreover, this invention is applicable to semiconductor laser devices in which the thickness of the current blocking layer is partly changed so that the thicknesses of the portions of the active layer in the vicinity of the facets become thinner than that of the portion of the active layer in the center of the resonator, thereby attaining a decrease in the density of the optical intensity of the active layer in the vicinity of the facets, and, of course, the same effect as mentioned above can be attained.

Moreover, this invention is applicable to index guided semiconductor laser devices, other than the above-mentioned semiconductor laser devices with a structure that causes light absorbence so as to give arise to a difference in the refractive index of the active layer in the transverse direction, examples of which are buried heterostructure semiconductor laser devices, mesa-stripe type semiconductor laser devices, channeled substrate planer semiconductor laser devices, and so on, and the same effect as mentioned above can be attained.

It is understood that various other modifications will be apparent to and can be readily made by those skilled in the art without departing from the scope and spirit of this invention. Accordingly, it is not intended that the scope of the claims appended hereto be limited to the description as set forth herein, but rather than the claims be construed as encompassing all the features of patentable novelty that reside in the present invention, including all features that would be treated as equivalents thereof by those skilled in the art to which this invention pertains.

What is claimed is:

1. In a VSIS index guided semiconductor laser device having a substrate with a striped V-channel and an active layer disposed above said substrate, a difference between the effective refractive index of the region of said active layer positioned outside of said striped V-channel and the effective refractive index of the region of said active layer positioned over said striped V-channel being created within said active layer, resulting in a striped optical waveguide within said active layer, which corresponds to said striped-channel, wherein said laser device comprises at least a part of said waveguide having continuous indentations at the interface between the waveguide and the outside of the waveguide, whereby only laser light of a high-order transverse mode is radiated from said waveguide to the outside of the waveguide and only laser light of the fundamental transverse mode is propagated within said waveguide.

2. An index guided semiconductor laser device according to claim 1, wherein the inclination of the indentations of said waveguide is at a fixed value such that only laser light of the fundamental oscillation mode attains a total internal reflection on the indented wall of said waveguide and laser light of a high-order mode permeates from the indented wall of said waveguide to the outside of said waveguide.

3. An index guided semiconductor laser devices according to claim 1, wherein said waveguide has indentations which are formed so that the indentation faces are made up of straight planes or lines, which form distinct angles at the points where these lines or surfaces meet, said indentations being dispersed on both sides of the waveguide in such a way that the sides of the waveguide are at all times mirror images of each other.

4. An index guided semiconductor laser device according to claim 1, wherein said waveguide has indentations which are formed so that the indentation faces are made up of straight planes or lines which form distinct angles at the points where these lines or surfaces meet, said indentations being dispersed on only one side of the waveguide.

5. An index guided semiconductor laser device according to claim 1, wherein said waveguide has indentations which are formed so that the indentation faces are made up of straight planes or lines which form distinct angles at the points where these lines or surfaces meet, said indentations being dispersed on both sides of the waveguide in such a way that the sides of the waveguide are at all times parallel.

6. An index guided semiconductor laser devise according to claim 1, wherein said waveguide has indentations which are formed so that the indentation faces are made up of curved planes or lines which do not form distinct angles at the points where these lines or surfaces meet, said indentations being dispersed on both sides of the waveguide in such a way that the sides of the waveguide are at all times parallel.

7. An index guided semiconductor laser devise according to claim 1, wherein said waveguide has indentations which are formed so that the indentation faces are made up of curved planes or lines which do not form distinct angles at the points where these lines or surfaces meet, said indentations being dispersed on both sides of the waveguide in such a way that the sides of the waveguide are at all times mirror images of each other.

8. An index guided semiconductor laser devise according to claim 1, wherein said waveguide has indentations which are formed so that the indentation faces are made up of curved planes or lines which do not form distinct angles at the points where these lines or surfaces meet, said indentations being dispersed on only one side of the waveguide.

* * * * *